(12) United States Patent
Mayer et al.

(10) Patent No.: US 7,851,343 B2
(45) Date of Patent: Dec. 14, 2010

(54) METHODS OF FORMING OHMIC LAYERS THROUGH ABLATION CAPPING LAYERS

(75) Inventors: Eric Mayer, Raleigh, NC (US); Marc Alberti, Morrisville, NC (US)

(73) Assignee: Cree, Inc., Durham, NC (US)

( * ) Notice: Subject to any disclaimer, the term of this patent is extended or adjusted under 35 U.S.C. 154(b) by 276 days.

(21) Appl. No.: 11/763,081

(22) Filed: Jun. 14, 2007

(65) Prior Publication Data

US 2008/0311736 A1 Dec. 18, 2008

(51) Int. Cl.
H01L 21/44 (2006.01)

(52) U.S. Cl. .............. 438/597; 438/602; 438/769; 438/931; 257/E21.294

(58) Field of Classification Search .......... 438/597, 438/602, 796, 931; 257/E21.294
See application file for complete search history.

(56) References Cited

U.S. PATENT DOCUMENTS

| | | | |
|---|---|---|---|
| 4,672,740 | A | 6/1987 | Shirai et al. |
| 5,087,949 | A | 2/1992 | Haitz |
| 5,943,590 | A * | 8/1999 | Wang et al. ............ 438/427 |
| 6,110,813 | A | 8/2000 | Ota et al. |
| 6,274,889 | B1 | 8/2001 | Ota et al. |
| 6,500,770 | B1 * | 12/2002 | Cheng et al. ............ 438/782 |
| 6,878,574 | B2 | 4/2005 | Tomoda et al. |
| 2001/0010702 | A1 | 8/2001 | Tanaka |
| 2001/0017409 | A1 | 8/2001 | Hiroki et al. |
| 2001/0019133 | A1 | 9/2001 | Konuma et al. |
| 2001/0027001 | A1 | 10/2001 | Yoshida et al. |
| 2001/0045932 | A1 | 11/2001 | Mukao |
| 2002/0019084 | A1 | 2/2002 | Francis et al. |
| 2002/0027716 | A1 | 3/2002 | Tanaka |
| 2002/0048829 | A1 | 4/2002 | Yamazaki et al. |
| 2002/0094612 | A1 | 7/2002 | Nakamura et al. |
| 2002/0094613 | A1 | 7/2002 | Yamazaki et al. |
| 2002/0102098 | A1 | 8/2002 | Camm et al. |
| 2002/0119585 | A1 | 8/2002 | Yamazaki et al. |
| 2002/0121642 | A1 | 9/2002 | Doverspike et al. |
| 2002/0125480 | A1 | 9/2002 | Nakamura et al. |
| 2002/0146872 | A1 | 10/2002 | Yasumuki et al. |
| 2002/0158288 | A1 | 10/2002 | Yamesaki et al. |
| 2002/0182783 | A1 | 12/2002 | Takayama et al. |
| 2002/0192914 | A1 | 12/2002 | Kizilyalli et al. |
| 2002/0192931 | A1 | 12/2002 | Hazakawa |
| 2003/0010980 | A1 | 1/2003 | Yamazaka et al. |
| 2003/0013280 | A1 | 1/2003 | Yamazaka |
| 2003/0022471 | A1 | 1/2003 | Taketomi et al. |
| 2003/0059990 | A1 | 3/2003 | Yamazaki |
| 2003/0080099 | A1 | 5/2003 | Tanaka et al. |

(Continued)

OTHER PUBLICATIONS

International Search Report for PCT/US2004/026210, mailed Dec. 6, 2004.

(Continued)

Primary Examiner—Alexander G Ghyka
Assistant Examiner—Abdulfattah Mustapha
(74) Attorney, Agent, or Firm—Myers Bigel Sibley & Sajovec, P.A.

(57) ABSTRACT

A method of forming an ohmic layer for a semiconductor device includes forming a metal layer on a Silicon Carbide (SiC) layer and forming an ablation capping layer on the metal layer. Laser light is impinged through the ablation capping layer to form a metal-SiC material.

21 Claims, 3 Drawing Sheets

U.S. PATENT DOCUMENTS

| | | |
|---|---|---|
| 2003/0087522 A1 | 5/2003 | Ngo et al. |
| 2003/0090481 A1 | 5/2003 | Kimura |
| 2003/0094641 A1 | 5/2003 | Gonzalez et al. |
| 2003/0117352 A1 | 6/2003 | Kimura |
| 2003/0132931 A1 | 7/2003 | Kimura et al. |
| 2003/0148594 A1 | 8/2003 | Yamasaki et al. |
| 2003/0151048 A1 | 8/2003 | Gonzalez et al. |
| 2003/0164522 A1 | 9/2003 | Kato et al. |
| 2003/0168437 A1 | 9/2003 | Tanaka |
| 2003/0173570 A1 | 9/2003 | Yamazaki et al. |
| 2003/0183875 A1 | 10/2003 | Isobe et al. |
| 2003/0201496 A1 | 10/2003 | Yamasaki et al. |
| 2003/0206732 A1 | 11/2003 | Camm et al. |
| 2004/0012338 A1 | 1/2004 | Smith et al. |
| 2004/0016969 A1 | 1/2004 | Bohr |
| 2004/0018672 A1 | 1/2004 | Bohr |
| 2004/0031961 A1 | 2/2004 | Zhang et al. |
| 2004/0056915 A1 | 3/2004 | Miyazawa |
| 2004/0063310 A1 | 4/2004 | Ngo et al. |
| 2004/0079923 A1 | 4/2004 | Yamazaki et al. |
| 2004/0080474 A1 | 4/2004 | Kimura |
| 2004/0151993 A1* | 8/2004 | Hasegawa et al. ............. 430/5 |
| 2005/0104072 A1* | 5/2005 | Slater et al. ................. 257/77 |
| 2005/0255650 A1* | 11/2005 | Hasunuma et al. ......... 438/253 |
| 2007/0026689 A1* | 2/2007 | Nakata et al. ............... 438/781 |
| 2008/0173975 A1* | 7/2008 | Chen et al. .................. 257/529 |

OTHER PUBLICATIONS

Eryu, et al. "Formation of an Ohmic Electrode in SiC Using A Pulsed Laser Irradiation Method" *Nuclear Instruments and Methods in Physics Research B* 121:419-421 (1997).

Kalinina, et al. "Effect of Ultrashort Laser Pulses on the Electrophysical Properties of Silicon Carbide" *Sov. Tech. Phys. Lett.* 11(6): 278-279 (1985).

Ota, et al. "Laser Alloying for Ohmic Contacts on SiC at Room Temperature" *Materials Science Forum* vols. 264-268; pp. 783-786 (1998).

Pender, et al. "Gradients in Elastic Modulus for Improved Contact-Damage Resistance. Part I: The Silicon Nitride-Oxynitride Glass System" *Acta Materialia* 49(2001): 3255-3262, (2001).

Vizváry, et al. "Elasticity Modulus Measurement of Silicon-Nitride" Proceedings of Fourth Conference on Mechanical Engineering, (Eds Penninger A, Kullmann L, Vörös G), BMGE, pp. 215-219, (2004).

Yi and Kim "Tension Test with Single-Crystalline-Silicon Microspecimen" Proc. MEMS (MEMS-vol. 1), ASME Int. Mechanical Engineering Congress and Exposition, Nashville, TN, pp. 81-86 (1999).

* cited by examiner

METHODS OF FORMING OHMIC LAYERS THROUGH ABLATION CAPPING LAYERS

FIELD OF THE INVENTION

This invention relates to methods of forming microelectronic devices, and more particularly, to the fabrication of ohmic layers in microelectronic devices.

BACKGROUND

It is known to form metal ohmic contacts by depositing a metal, such as nickel, and annealing the metal at a high temperature (such as temperatures greater than 900° C.). High temperature annealing may damage epitaxial layers of gallium nitride based materials included on the SiC substrate. Accordingly, there is a need for improved methods for forming ohmic contacts to substrates of materials such as SiC, GaN, InGaN or the like.

It is also known to form metal ohmic contacts by annealing a metal layer on a substrate using a laser. Such an approach is described in, for example, U.S. Patent Application Publication No. 2005/0104072 by Slater, Jr. et al.

SUMMARY

Figure 1:
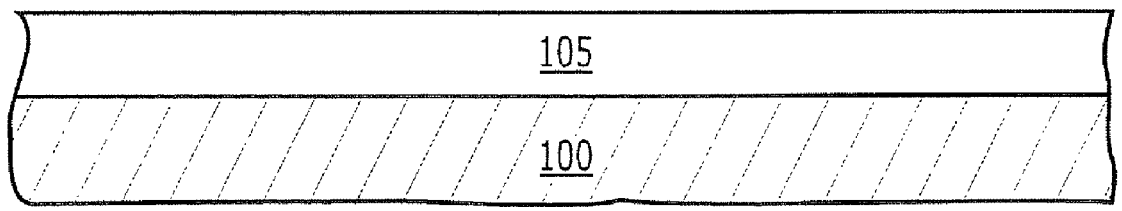
FIGS. 1-5 are cross sectional views that illustrate methods of forming ohmic layers in semiconductor devices in some embodiments according to the invention.

Embodiments according to the invention can provide methods of forming ohmic layers through ablation capping layers. Pursuant to these embodiments, a method of forming an ohmic layer for a semiconductor device includes forming a metal layer on a Silicon Carbide (SiC) layer and forming an ablation capping layer on the metal layer. Laser light is impinged through the ablation capping layer to form a metal-SiC material. In some embodiments according to the invention, an ablation threshold level for the metal layer is less than an ablation threshold level for the SiC layer. In some embodiments according to the invention, the SiC layer is a SiC substrate.

In some embodiments according to the invention, the ablation capping layer is a dielectric material having a thickness of about 25 Angstroms to about 2500 Angstroms. In some embodiments according to the invention, the dielectric material is silicon dioxide, silicon nitride, and/or silicon oxynitride. In some embodiments according to the invention, the ablation capping layer is a material having a stiffness of more than about 10 GigaPascal (Gpa).

In some embodiments according to the invention, the ablation capping layer is a material having an optical transmissivity so that about 90 percent or more of laser light energy impinged thereon is transmitted to the metal layer underlying the ablation capping layer.

In some embodiments according to the invention, a method of forming an ohmic layer for a semiconductor device includes forming a resist layer on a Silicon Carbide (SiC) layer and patterning the resist layer to form a recess therein to expose the SiC layer at a bottom thereof. A conformal metal layer is formed in the recess on the exposed SiC layer and a conformal ablation capping layer is formed on the conformal metal layer including in the recess. Laser light is impinged through the ablation capping layer so that a metal-SiC material is formed and to remove a portion of the conformal ablation capping layer at the bottom of the recess. In some embodiments according to the invention, the formation of the metal-substrate layer material can be accompanied by ablation of the substrate layer. The conformal ablation capping layer and the resist layer are removed from the SiC layer and a portion of the metal layer outside the recess is removed.

In some embodiments according to the invention, a method of forming an ohmic layer for a semiconductor device includes forming a resist layer on a Silicon Carbide (SiC) layer and patterning the resist layer to form a recess therein to expose the SiC layer at a bottom of the recess. A conformal metal layer is formed in the recess on the exposed SiC layer. A conformal ablation capping layer is formed on the conformal metal layer including in the recess and laser light is impinged through the ablation capping layer onto the SiC layer to form a metal-SiC material at the bottom of the recess and to remove a portion of the conformal ablation capping layer at the bottom of the recess. The conformal ablation capping layer and the resist layer are removed from the SiC layer and a portion of the metal layer outside the recess is removed.

DETAILED DESCRIPTION OF EMBODIMENTS ACCORDING TO THE INVENTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As used herein the term "ohmic" refers to contacts or layers where an impedance associated therewith is substantially given by the relationship of Impedance=V/I, where V is a voltage across the contact/layer and I is the current, at substantially all expected operating frequencies (i.e., the impedance associated with the ohmic contact/layer is substantially the same at all operating frequencies). For example, in some embodiments according to the invention, an ohmic contact can have a specific contact resistivity of less than about 10 e-03 ohm-cm$^2$ and, in some embodiments less than about 10 e-04 ohm-cm$^2$. Thus, a contact that is rectifying or that has a high specific contact resistivity, for example, a specific contact resistivity of greater than about 10 e-03 ohm-cm$^2$, is not an ohmic contact as that term is used herein.

As used herein, a "metal-substrate layer material" includes mixtures containing a metal and the underlying substrate fused together or dissolved into each other when, for example, ablation of the metal and substrate layers occurs. For example, a "metal-Silicon Carbide material" can include a metal and Silicon Carbide (SiC) fused together as a result of ablation. Accordingly, a Ni—SiC material can be a mixture (or alloy) of nickel and SiC when the SiC substrate is ablated so that a Ni-silicide is formed.

As described herein in greater detail, in some embodiments according to the invention, the metal layer is formed on a substrate layer and an ablation capping layer is formed on the metal layer. Laser light is impinged through the ablation capping layer onto the metal to form a metal-substrate layer material to provide an ohmic contact for the device. In some embodiments according to the invention, the formation of the metal-substrate layer material can be accompanied by ablation of the substrate layer.

As appreciated by the present inventors, the ablation capping layer is optically transmissive so that the laser light impinged thereon passes through the ablation capping layer to break bonds between elements in the substrate layer, which can alloy with the metal constituent element included in the metal layer to provide the ohmic contact for the device. The ablation capping layer is selected to be both sufficiently optically transmissive as well as to have sufficient mechanical rigidity to promote contact of the metal layer with the underlying substrate layer while the ablation thereof occurs. Furthermore, as the underlying substrate layer is ablated by the impinged laser light, the overlying metal layer as well as the ablation capping layer can be removed by the effect of the laser.

For example, in some embodiments according to the invention, the ablation capping layer is a dielectric material having a thickness of about 25 angstroms to about 2500 angstroms. In still further embodiments according to the invention, the ablation capping layer is a silicon dioxide layer, or a silicon nitride layer, and/or a silicon oxynitride layer. In still further embodiments according to the invention, the ablation capping layer can be a metal (which provides sufficient optical transmissivity) or a relatively stiff plastic (which also provides sufficient optical transmissivity).

In other embodiments according to the invention, the ablation capping layer is a material that has a stiffness of more than about 10 GigaPascal (Gpa).

In still further embodiments according to the invention, the ohmic contact can be provided by forming a resist layer on a substrate layer and patterning the resist to form recesses therein that expose portions of the underlying substrate layer at the bottoms of the recesses. A conformal metal layer is formed in the recess on the exposed portions of the substrate layer. A conformal ablation capping layer is then formed on the conformal metal layer including in the recesses. Laser light is impinged through the conformal ablation capping layer so that a metal-substrate layer material is formed and to remove at least a portion of the conformal ablation capping layer at the bottom of the recess. Any remaining portions of the conformal ablation capping layer, the resist layer, and the remnants of the metal layer can then be removed from the substrate layer (including portions outside the recesses).

FIGS. 1-5 are cross sectional views that illustrate methods of forming ohmic contacts for semiconductor devices in some embodiments according to the invention. In particular, FIG. 1 is a cross sectional view that illustrates a substrate 100 having a resist layer 105 formed thereon. In some embodiments according to the invention, the substrate layer 100 can be formed of a material, such as Diamond, Tungsten Carbide, Silicon Carbide, Aluminum Oxide, Beryllium Oxide, Magnesium Oxide, Zirconium Oxide, Mullite, Silicon, Silica glass, Soda-lime glass, or the like.

Figure 2:
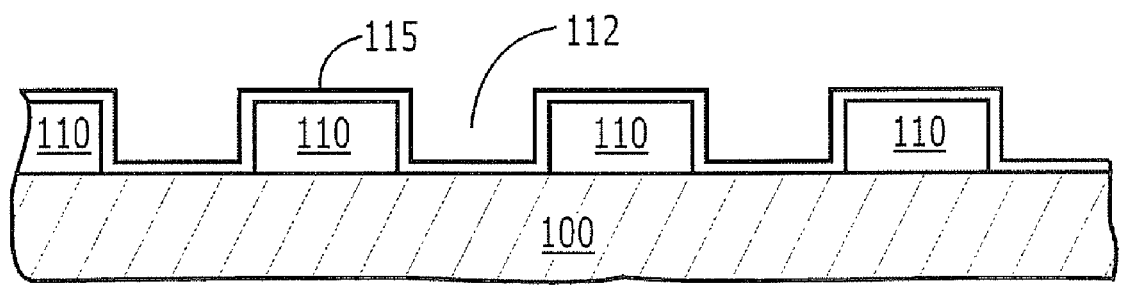

According to FIG. 2, the resist layer 105 is patterned to form a resist pattern 110 that includes recesses 112 that expose at least portions of the underlying substrate layer 100. A conformal metal layer 115 is formed on the resist pattern 110 including in the recesses 112 on the exposed portions of the substrate layer 100 at the bottoms thereof. In some embodiments according to the invention, the metal layer 115 is Tungsten, Chromium, Beryllium, Nickel, Copper, Titanium, Aluminum, or the like. In some embodiments according to the invention, the conformal metal layer 115 is formed to a thickness of about 1000 Angstroms. It will be further understood that the conformal metal included in the metal layer 115 is subsequently alloyed with a constituent element of the substrate layer 100. For example, if the substrate layer 100 is silicon carbide and the metal layer 115 is nickel, the subsequently formed ohmic contact will include a nickel silicide material resulting from the alloy of the nickel element in the conformal metal layer 115 and the silicon constituent element of the silicon carbide.

Furthermore, in some embodiments according to the invention, the material of the conformal metal layer 115 has a lower laser ablation threshold level than the laser ablation threshold level of the substrate layer 100. For example, in some embodiments according to the invention, where the conformal metal layer 115 is nickel and the underlying substrate layer 100 is silicon carbide, the nickel is ablated at a lower energy level than is the silicon carbide. In other words, the nickel may be ablated before the underlying SiC as the substrate layer 100.

Figure 3:
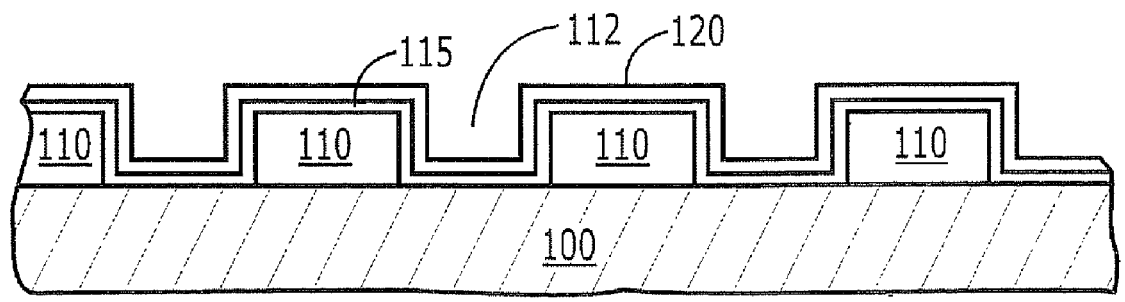

According to FIG. 3, a conformal ablation capping layer 120 is formed on the conformal metal layer 115 both inside and outside the recesses 112. It will be understood that the conformal ablation capping layer 120 is material selected to provide sufficient mechanical stiffness during the subsequent ablation process so that the underlying conformal metal layer 115 maintains contact with the exposed portions of the substrate layer 100.

As appreciated by the present inventors, maintaining direct contact between the conformal metal layer 115 and the underlying exposed substrate layer 100 during ablation promotes the formation of ohmic layers having lower specific resistivities. In contrast, if a metal layer is allowed to lift off the underlying substrate during an ablation process, the metal element in the metal layer may not alloy as efficiently with the constituent element of the underlying substrate during ablation, thereby possibly resulting in higher resistivity layers. Therefore, the ablation capping layer 120 is selected to provide sufficient optical transmissivity to allow subsequently impinged laser light to pass therethrough onto the underlying conformal metal layer 115 and substrate layer 100. The stiffness of the conformal ablation capping layer 120 may increase contact between the conformal metal layer 115 and the exposed portions of the substrate layer 100 so that improved ohmic layers are formed.

In some embodiments according to the invention, the conformal ablation capping layer 120 has an optical transmissivity of about 90 percent or more so that at least about 90 percent of the laser light impinged thereon passes through the conformal ablation capping layer to the underlying conformal metal layer 115. Furthermore, in some embodiments according to the invention, the conformal ablation capping layer 120 can be a dielectric material, such as silicon dioxide, silicon nitride, and/or silicon oxynitride.

In still further embodiments according to the invention, the conformal ablation capping layer 120 can be a metal or polysilicon material that provides sufficient mechanical rigidity to maintain the contact of the conformal metal layer 115 with the underlying substrate as described above. For example, in some embodiments according to the invention, the metal or polysilicon making up the conformal ablation capping layer 120 is relatively thin so that sufficient optical transmissivity is provided. In still other embodiments according to the invention, the energy level of the impinged laser light can be increased to compensate for reduced optical transmissivity of a metal or polysilicon conformal ablation capping layer 120.

Accordingly, the conformal ablation capping layer 120 provides the mechanical rigidity to maintain contact between the conformal metal layer 115 and the underlying exposed portions of the substrate layer 100 as the metal in the conformal metal layer 115 may have a lower ablation threshold level than the substrate layer 100. Therefore, the conformal ablation capping layer 120 promotes increased contact between the conformal metal layer 115 and the substrate 100 to provide lower resistivity ohmic layers, particularly where the ablation threshold of the metal layer is less than the ablation threshold level of the underlying substrate.

Figure 4:
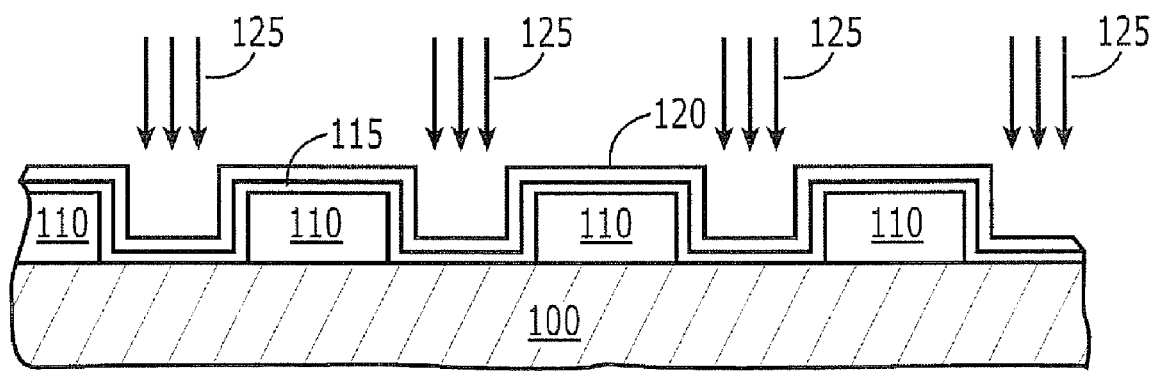

According to FIG. 4, laser light 125 is impinged through the conformal ablation capping layer 120 onto the conformal metal layer 115 and portions of the underlying substrate 100. The impinged laser light 125 can, in some embodiments, cause ablation of the conformal metal layer 115 as well as the underlying substrate layer 100 along with the formation of a metal-substrate layer material. Accordingly, the metal-substrate layer material is formed to provide the ohmic layer for the device. For example, in some embodiments according to the invention where the conformal metal layer 115 is nickel and the substrate layer is silicon carbide, the ohmic contact is formed of a nickel silicide material. Furthermore, the impinged laser light 125 can also cause the evaporation of remaining portions of the conformal metal layer 115 and the overlying ablation capping layer 120. It will be understood that the laser light 125 can have a substantially uniform energy distribution over the impinged area of the metal layer/substrate layer.

It will be understood that the laser light used to form the ohmic layers/contacts described herein can be a laser light having a wavelength and intensity sufficient to ablate the substrate layer to form the metal-substrate layer material at the interface of the metal layer and the substrate layer. For example, in embodiments using 6H SiC as the substrate, laser ablation may be accomplished by impinging laser light having a wavelength of about 248 nanometers to about 308 nanometers at an energy of about 2.8 joules per square centimeter, through the ablation capping layer, as a single pulse having a duration of about 30 nanoseconds.

In other embodiments according to the invention where, for example, the SiC substrate is 4H SiC, the laser light may have a wavelength of about 248 nanometers to about 308 nanometers and an energy of about 4.2 joules per square centimeter applied, through the ablation capping layer, in about 5 pulses, each having a duration of about 30 nanoseconds. In still other embodiments according to the invention, other wavelengths and energies may be used to provide annealing at the interface location of the metal layer and the SiC substrate via absorption of light including photon energies that are above the bandgap of the SiC substrate. It will be understood that pulse and/or continuous loop lasers may also be utilized.

The laser light 125 is impinged on through the metal layer according to a predetermined pattern. That is, some interface locations of the metal layer and the underlying substrate 105 are impinged by the laser light 125 whereas other locations are not impinged by the laser light 125. In some embodiments according to the invention, the laser light 525 is impinged on the metal layer/substrate by moving a laser beam above the metal layer and activating/deactivating the laser to produce the laser light 125 according to the desired pattern. It will be understood that the laser light may be activated/de-activated by pulsing the laser on/off or by modulating the laser beam to form the metal-substrate material where desired and to avoid the formation of the metal-substrate material otherwise.

Regarding "moving" the laser beam described above, it will be understood that in some embodiments according to the invention, the laser beam can be moved in discreet steps according to the pattern whereas in other embodiments according to the invention, the laser beam is moved continuously and activated/deactivated at the appropriate intervals according to the pattern. It will be further understood that the laser beam can be "moved" by, for example, moving a mirror above the metal layer to reflect the laser beam. Alternatively, the laser that generates the laser beam may be moved above the metal layer. In still other embodiments according to the invention, the substrate can be moved beneath a "fixed" laser beam. For example, the substrate can be moved in increments of the mask pitch and stopped at each location where the laser is activated for a number of pulses (or duration) at each location.

It will be also understood that an electron beam may be used as an alternative to laser light. Accordingly, in each of the embodiments described above, an electron beam may be used to ablate the substrate layer to form the metal-substrate layer material thereat. It will be understood that the metal-substrate layer ohmic contacts can be contacts for any device and may be included on an epitaxial layer.

Figure 5:
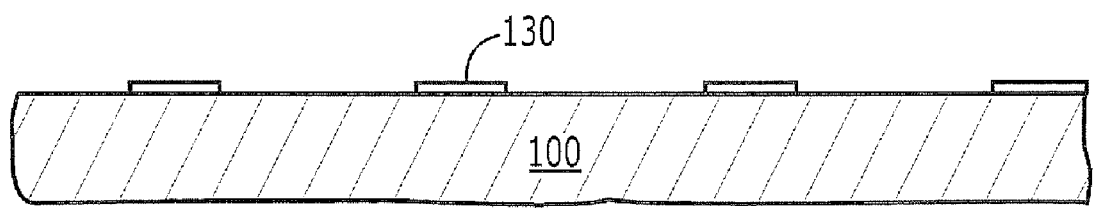
Figure 6:
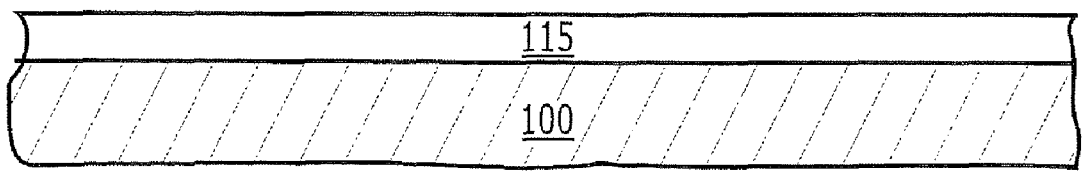
FIGS. 6-9 are cross sectional views that illustrate methods of forming ohmic layers in semiconductor devices in some embodiments according to the invention.
Figure 7:
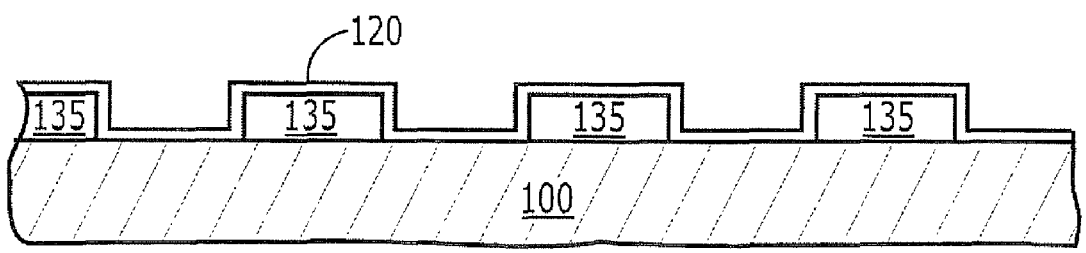

As illustrated in FIG. 5, any remaining portions of the resist pattern 110 as well as the conformal metal layer 115 and conformal ablation capping layer 120 are removed to provide ohmic layers 130 on the substrate 100 where the recesses 112 were located. Subsequently, it will be understood that the ohmic layers 130 shown in FIG. 5 can be included in semiconductor devices (such as light emitting devices) provided through back-end processing. Back-end processing used to provide light emitting devices can be performed as described in, for example, U.S. Patent Application Publication No. 2005/0104072 by Slater, Jr. et al., the contents of which are incorporated herein by reference.

FIGS. 6-9 are cross sectional views that illustrate methods of forming ohmic contact layers in some embodiments according to the invention. According to FIG. 6, the substrate layer 100 is provided with a metal layer 115 thereon without the formation of an intervening photoresist material 100 as shown in FIGS. 1-5. The materials used to form the substrate 100 and the metal layer 115 can be the same as those described above in reference to FIGS. 1-5. According to FIG. 7, the metal layer 115 is patterned to provide metal layers 135 on the substrate layer 100. The conformal ablation capping layer 120 is formed on the metal patterns 135 and on the substrate layer 100.

Figure 8:
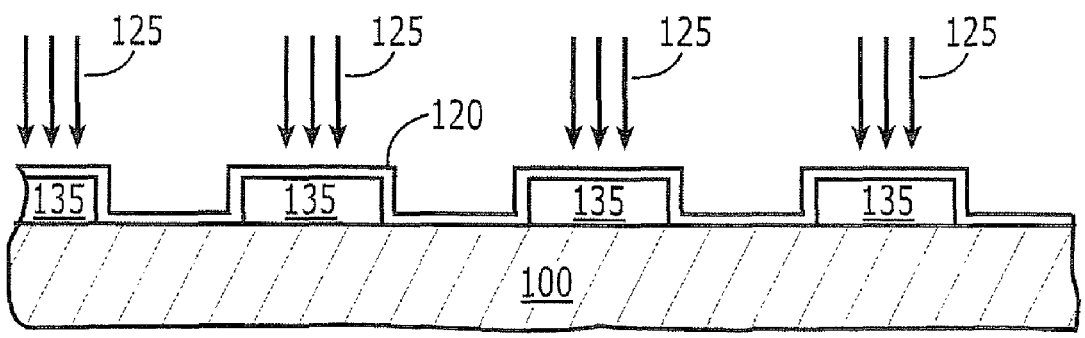
Figure 9:
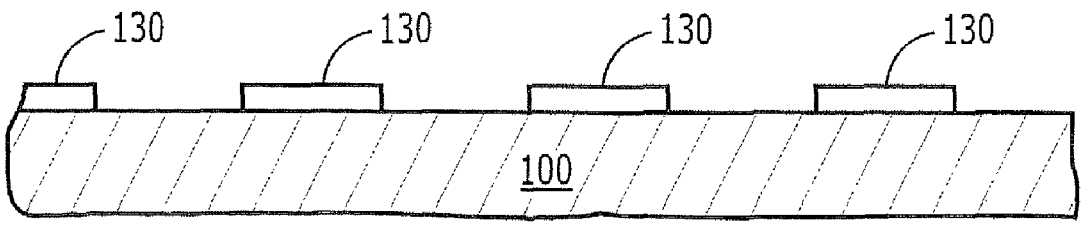

According to FIG. 8, laser light 125 is impinged through the conformal ablation capping layer 120 onto the metal layers 135 and the underlying substrate layer 100. As described above in reference to FIGS. 1-5, the stiffness of the conformal ablation capping layer 120 promotes contact between the metal layers 135 and the underlying substrate layer 100. Furthermore, the conformal ablation capping layer 120 is sufficiently optically transmissive so that sufficient energy of the impinged laser light 125 is provided to the underlying metal layers 135 and substrate layer 100. According to FIG. 9, the ablation process provides for the formation of ohmic layers 130 on the substrate 100 at locations corresponding to the metal layers 135 shown in FIG. 8.

As described above, in some embodiments according to the invention, the metal layer is formed on a substrate layer and an ablation capping layer is formed on the metal layer. Laser light is impinged through the ablation capping layer onto the metal layer to form a metal-substrate layer material to provide an ohmic contact for the device.

As appreciated by the present inventors, the ablation capping layer is optically transmissive so that the laser light impinged thereon passes through the ablation capping layer to break bonds between elements in the substrate layer, which can alloy with the metal constituent element included in the metal layer to provide the ohmic contact for the device. The ablation capping layer is selected to be both sufficiently optically transmissive as well as to have sufficient mechanical rigidity to promote contact of the metal layer with the underlying substrate layer. Furthermore, as the underlying substrate layer is ablated by the impinged laser light, the overlying metal layer as well as the ablation capping layer can be removed by the effect of the laser.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of forming an ohmic layer for a semiconductor device, comprising:
   forming a metal layer on a Silicon Carbide (SiC) layer;
   forming an ablation capping layer on the metal layer; and
   impinging laser light, through the ablation capping layer, to form a metal-SiC material.

2. A method according to claim 1 wherein an ablation threshold level for the metal layer is less than an ablation threshold level for the SiC layer.

3. A method according to claim 1 wherein the SiC layer comprises a SiC substrate.

4. A method according to claim 1 wherein the ablation capping layer comprises a dielectric material having a thickness of about 25 Angstroms to about 2500 Angstroms.

5. A method according to claim 1 wherein a dielectric material comprises silicon dioxide, silicon nitride, and/or silicon oxynitride.

6. A method according to claim 1 wherein the ablation capping layer comprises a material have a stiffness of more than about 10 GigaPascal (Gpa).

7. A method according to claim 1 wherein the ablation capping layer comprises a metal having a thickness of about 1000 Angstroms.

8. A method according to claim 1 wherein the ablation capping layer comprises a polysilicon layer having a thickness of about 1000 Angstroms.

9. A method according to claim 1 wherein the laser light has a wavelength of less than about 308 nm.

10. A method according to claim 9 wherein impinging laser light comprises impinging laser light for about 30 ns.

11. A method according to claim 1 wherein the laser light has a wavelength of about 248 nm.

12. A method according to claim 1 wherein impinging laser light through the ablation capping layer comprises impinging a single laser light pulse through the ablation capping layer.

13. A method according to claim 12 wherein impinging laser light through the ablation capping layer causes molecular bonds between constituent elements of Silicon and Carbon in the SiC material to be broken.

14. A method according to claim 1 wherein the laser light has a substantially uniform energy distribution profile.

15. A method according to claim 1 wherein the ablation capping layer comprises a material having an optical transmisivity so that about 90 percent or more of laser light energy impinged thereon is transmitted to the metal layer underlying the ablation capping layer.

16. A method of forming an ohmic layer for a semiconductor device, comprising:
  forming a resist layer on a Silicon Carbide (SiC) layer;
  patterning the resist layer to form a recess therein to expose the SiC layer at a bottom thereof;
  forming a conformal metal layer in the recess on the exposed SiC layer;
  forming a conformal ablation capping layer on the conformal metal layer including in the recess;
  impinging laser light, through the ablation capping layer, to ablate the SiC layer so that a metal-SiC material is formed and to remove a portion of the conformal ablation capping layer at the bottom of the recess; and
  removing the conformal ablation capping layer and the resist layer from the SiC layer and removing a portion of the metal layer outside the recess.

17. A method of forming an ohmic layer for a semiconductor device, comprising:
  forming a resist layer on a Silicon Carbide (SiC) layer;
  patterning the resist layer to form a recess therein to expose the SiC layer at a bottom of the recess;
  forming a conformal metal layer in the recess on the exposed SiC layer;
  forming a conformal ablation capping layer on the conformal metal layer including in the recess;
  impinging laser light, through the ablation capping layer, onto the SiC layer to form a metal-SiC material at the bottom of the recess and to remove a portion of the conformal ablation capping layer at the bottom of the recess; and
  removing the conformal ablation capping layer and the resist layer from the SiC layer and removing a portion of the metal layer outside the recess.

18. A method of forming an ohmic contact for a semiconductor device, comprising:
  impinging laser light, through an ablation capping layer, onto a metal layer on a substrate layer, to ablate the substrate layer to form metal layer-substrate layer material at a bottom of the recess and to remove a portion of the conformal ablation capping layer through which the laser is impinged; and
  removing the conformal ablation capping layer from the substrate layer outside the recess.

19. A method according to claim 18 wherein the ablation capping layer comprises a dielectric material having a thickness of about 25 Angstroms to about 2500 Angstroms.

20. A method according to claim 18 wherein a dielectric material comprises silicon dioxide, silicon nitride, and/or silicon oxynitride.

21. A method according to claim 18 wherein the ablation capping Layer comprises a material have a stiffness of more than about 10 GigaPascal (Gpa).

* * * * *